(12) United States Patent
Jain

(10) Patent No.: US 8,859,310 B2
(45) Date of Patent: Oct. 14, 2014

(54) METHODS OF FABRICATING OPTOELECTRONIC DEVICES USING SEMICONDUCTOR-PARTICLE MONOLAYERS AND DEVICES MADE THEREBY

(75) Inventor: Ajaykumar R. Jain, San Carlos, CA (US)

(73) Assignee: Versatilis LLC, Winooski, VT (US)

( * ) Notice: Subject to any disclaimer, the term of this patent is extended or adjusted under 35 U.S.C. 154(b) by 0 days.

(21) Appl. No.: 13/704,088

(22) PCT Filed: Jun. 10, 2011

(86) PCT No.: PCT/US2011/040048
§ 371 (c)(1),
(2), (4) Date: Dec. 13, 2012

(87) PCT Pub. No.: WO2011/159578
PCT Pub. Date: Dec. 22, 2011

(65) Prior Publication Data
US 2013/0092975 A1    Apr. 18, 2013

Related U.S. Application Data

(60) Provisional application No. 61/397,490, filed on Jun. 14, 2010, provisional application No. 61/398,027, filed on Jun. 21, 2010, provisional application No. 61/458,872, filed on Dec. 3, 2010.

(51) Int. Cl.
*H01L 21/00* (2006.01)
*H01L 31/18* (2006.01)
(Continued)

(52) U.S. Cl.
CPC ............ *H01L 33/52* (2013.01); *H01L 31/1864* (2013.01); *H01L 21/02546* (2013.01); *H01L 21/0254* (2013.01); *H01L 31/0384* (2013.01); *H01L 21/0256* (2013.01); *Y02E 10/547* (2013.01); *H01L 21/02557* (2013.01); *H01L 21/0243* (2013.01); *H01L 33/0066* (2013.01); *H01L 31/1896* (2013.01); *H01L 31/0392* (2013.01); *H01L 33/18* (2013.01);
(Continued)

(58) Field of Classification Search
USPC ........ 438/22, 29, 30; 257/429, 431, 439, 461, 257/464, E25.007, E25.009, E25.032; 359/245, 296, 315; 349/122
See application file for complete search history.

(56) References Cited

U.S. PATENT DOCUMENTS 4,173,494 A    11/1979  Johnson et al.
5,846,366 A *  12/1998  Jin et al. ............... 156/233
(Continued)

OTHER PUBLICATIONS

Altosaar, M et al., Monograin Layer Solar Cells, Elsevier Science, Thin Solid Films 431-432 (2003) 466-469; www.sciencedirect.com.
(Continued)

*Primary Examiner* — Su Kim
(74) *Attorney, Agent, or Firm* — Downs Rachlin Martin PLLC

(57) ABSTRACT

Methods of fabricating optoelectronic devices, such as photovoltaic cells and light-emitting devices. In one embodiment, such a method includes providing a substrate, applying a monolayer of semiconductor particles to the substrate, and encasing the monolayer with one or more coatings so as to form an encased-particle layer. At some point during the method, the substrate is removed so as to expose the reverse side of the encased-particle layer and further processing is performed on the reverse side. When a device made using such a method has been completed and installed into an electrical circuit the semiconductor particles actively participate in the photoelectric effect or generation of light, depending on the type of device.

49 Claims, 14 Drawing Sheets

(51) Int. Cl.
  *H01L 21/02* (2006.01)
  *H01L 31/0384* (2006.01)
  *H01L 33/52* (2010.01)
  *H01L 31/0392* (2006.01)
  *H01L 31/0352* (2006.01)
  *B82Y 20/00* (2011.01)
  *H01L 31/0203* (2014.01)
  *H01L 31/072* (2012.01)
  *H01L 33/00* (2010.01)
  *H01L 33/18* (2010.01)
  *H01L 33/32* (2010.01)

(52) U.S. Cl.
  CPC .... *H01L 21/0237* (2013.01); *H01L 31/035236* (2013.01); *H01L 31/1872* (2013.01); *H01L 21/02532* (2013.01); *B82Y 20/00* (2013.01); *H01L 31/0203* (2013.01); *H01L 31/1804* (2013.01); *H01L 33/32* (2013.01); *H01L 21/02664* (2013.01); *H01L 21/02601* (2013.01); *H01L 31/18* (2013.01); *H01L 31/072* (2013.01)
  USPC ............. 438/30; 257/429; 257/431; 257/439; 257/461; 257/464; 257/E25.009; 257/E25.032; 359/315; 349/122

(56) References Cited

U.S. PATENT DOCUMENTS

| | | |
|---|---|---|
| 2002/0036009 A1 | 3/2002 | Kyoda et al. |
| 2005/0247338 A1 | 11/2005 | Hakuma et al. |
| 2006/0219294 A1* | 10/2006 | Yabuuchi et al. ............. 136/263 |
| 2007/0089782 A1 | 4/2007 | Scheuten et al. |
| 2008/0017268 A1* | 1/2008 | Mahabir et al. ............... 138/141 |
| 2008/0078813 A1* | 4/2008 | Hwang ......................... 228/101 |
| 2010/0068839 A1 | 3/2010 | Ray et al. |

OTHER PUBLICATIONS

International Search Report and Written Opinion dated Dec. 26, 2011, in connection with related PCT/US2011/04008, filed Jun. 10, 2011, Jain.

\* cited by examiner

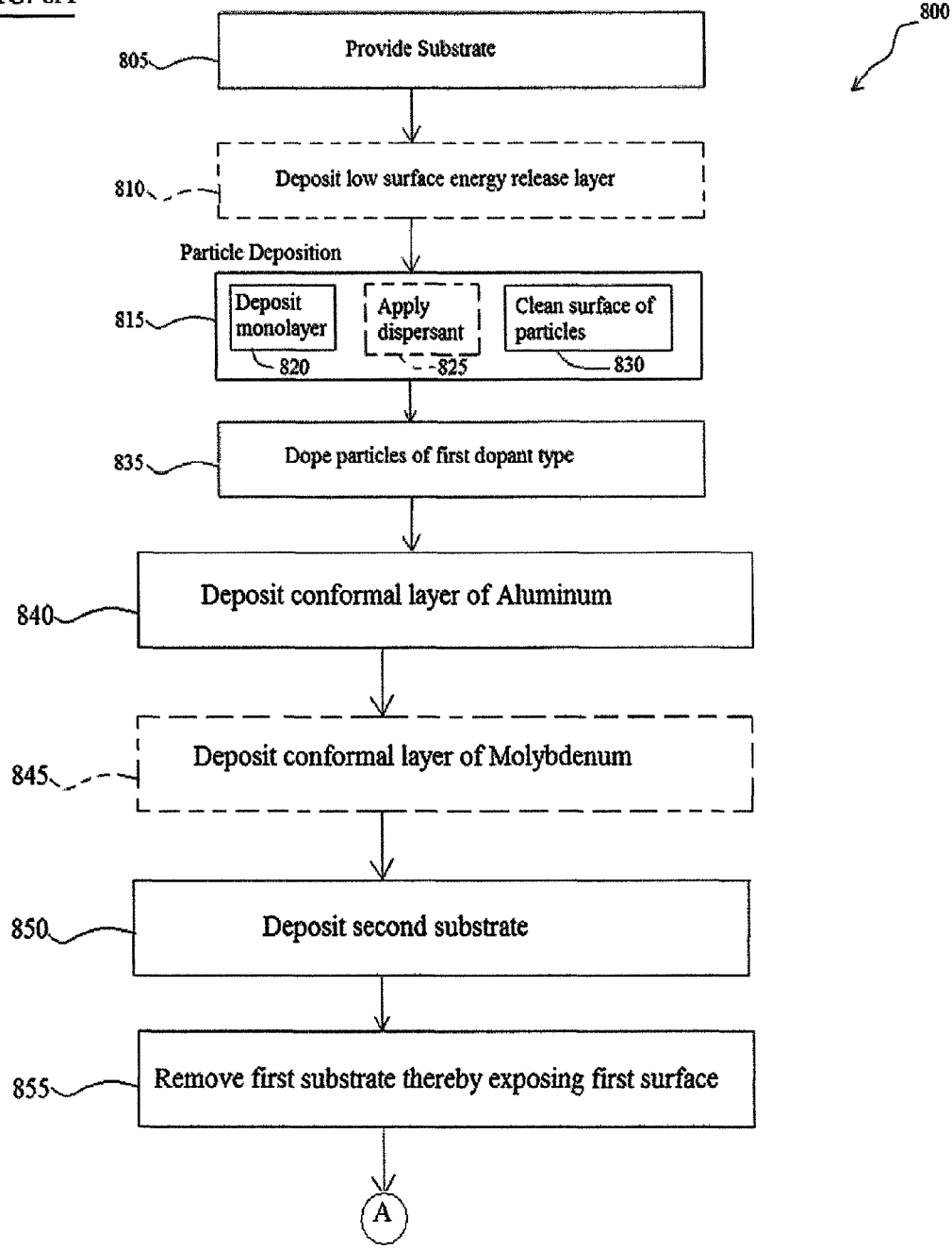

METHODS OF FABRICATING OPTOELECTRONIC DEVICES USING SEMICONDUCTOR-PARTICLE MONOLAYERS AND DEVICES MADE THEREBY

RELATED APPLICATION DATA

This application claims the benefit of priority of the following U.S. Provisional Patent Applications, each of which is incorporated by reference herein in its entirety: U.S. Provisional Patent Application Ser. No. 61/397,490, filed on Jun. 14, 2010, U.S. Provisional Patent Application Ser. No. 61/398,027, filed on Jun. 21, 2010; and U.S. Provisional Patent Application No. 61/458,872, filed on Dec. 3, 2010.

FIELD OF THE INVENTION

The present invention generally relates to the field of optoelectronic devices. In particular, the present invention is directed to methods of fabricating optoelectronic devices using semiconductor-particle monolayers and devices made thereby.

BACKGROUND

Optoelectronic devices, for example, p-n junction based devices, are typically fabricated using conventional semiconductor-layer-by-layer growth techniques. Some p-n junction based devices, such as light emitting diodes (LEDs) are designed to emit light. Other p-n junction based devices, such as solar cells and other photovoltaic devices, are specifically designed to transform incident light into electricity. In solar cells, the transformation of light into electricity occurs by an incident photon of light having sufficient energy to eject an electron from the p-n junction based device. In many cases, the conventional techniques used to make these devices are expensive, resulting in the devices being relatively high in cost.

SUMMARY OF THE DISCLOSURE

In one implementation, the present disclosure is directed to a method of fabricating an optoelectronic device. The method includes providing a first substrate having a first surface; applying a monolayer of semiconductor particles to the first surface; encasing the semiconductor particles of the monolayer with one or more coatings so as to form an encased-particle layer having an interface side confronting the first surface of the first substrate; separating the first substrate and the encased-particle layer from one another so as to expose the interface side of the encased-particle layer; and processing the interface side of the encased-particle layer to at least include a first electrode.

An apparatus including an optoelectronic device having optoelectronic functionality when operating. The optoelectronic device includes an encased-particle layer containing a monolayer of semiconductor particles encased by one or more coatings and including first and second sides spaced from one another, wherein the semiconductor particles participate in the optoelectronic functionality when the optoelectronic device is operating; a first electrode located on the first side of the encased-particle layer and electrically coupled to the semiconductor particles; and a second electrode located on the second side of the encased-particle layer and electrically coupled to the semiconductor particles.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIGS. 8A-8B is a flow diagram of an exemplary method of fabricating an optoelectronic device having a monolayer of particles wherein each particle includes dopants forming a p-n junction;

DETAILED DESCRIPTION

This disclosure addresses, in part, optoelectronic devices fabricated by incorporating a monolayer of semiconductor particles as an optoelectrically functional element of the device. As used herein, the term "functional element" refers to an electrical or optoelectrical circuit element that provides a basic electrical or optoelectrical function when subjected to electrical and/or electromagnetic stimulation. Examples of such devices include photovoltaic cells, in which the monolayer actively participates in the photovoltaic effect, and light-emitting devices, such as light emitting diodes (LEDs), in which the monolayer participates in the generation of light. A number of exemplary devices employing functional elements made from a monolayer of semiconductor particles are discussed in detail below. However, as those skilled in the art will appreciate from reading this entire disclosure, the exemplary devices shown herein are but a small selection of the devices that can employ the teachings disclosed herein. Indeed, some further examples of other electrical and optoelectrical functional semiconductor elements appear on pages 38 to 47, 62, and 69 to 87 of U.S. Provisional Patent Application No. 61/458,872, filed on Dec. 3, 2010, and titled "NOVEL METHOD OF MAKING SOLAR CELLS" (hereinafter, "the '872 application"), and are incorporated by reference herein. In addition, several examples of methods of fabricating a monolayer of semiconductor particles are described below.

General Overview

Figure 1A:
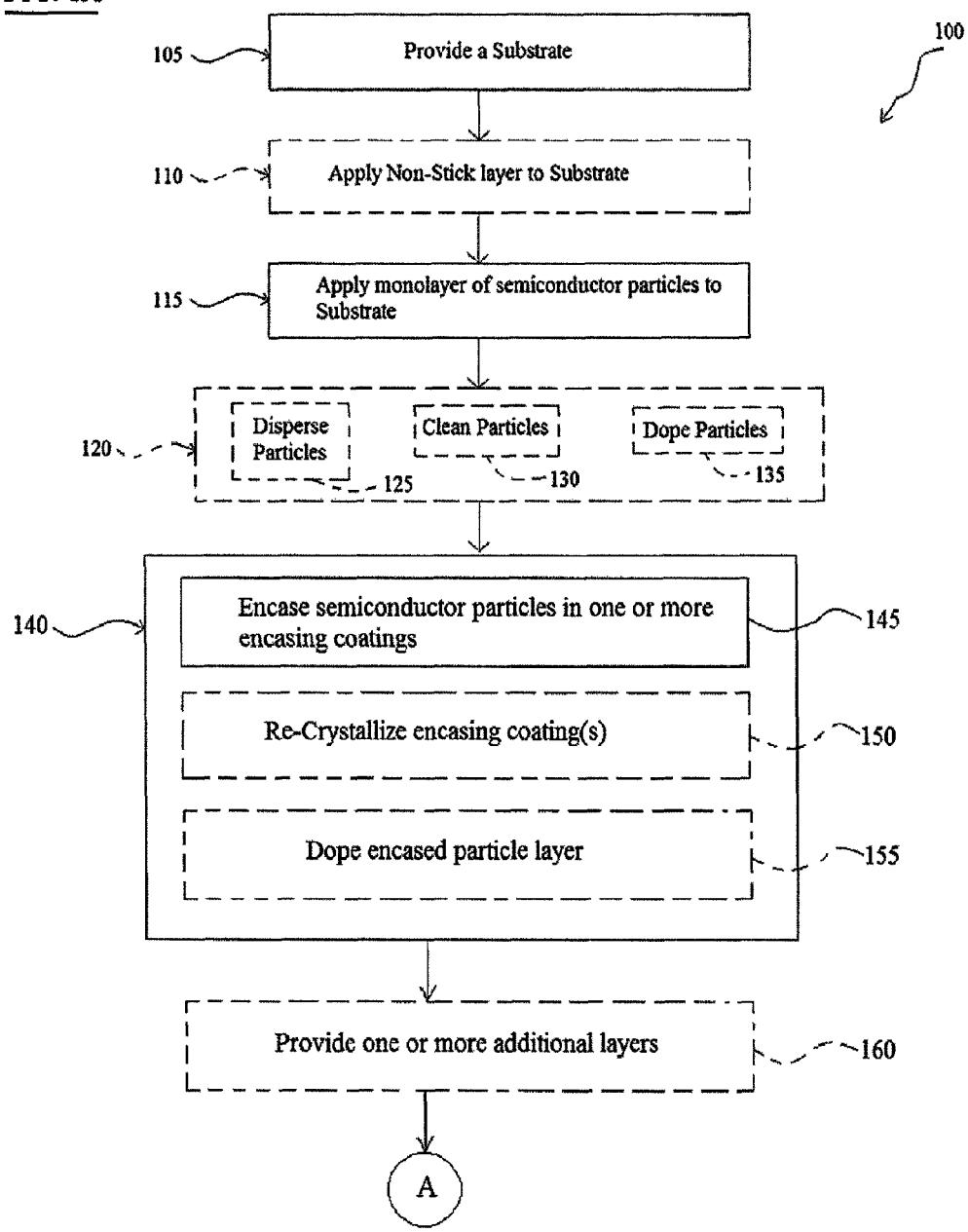
FIGS. 1A-1B is a flow diagram of an exemplary method of making an optoelectronic device having a semiconductor monolayer as an optoelectronically functional element.
Figure 1B:
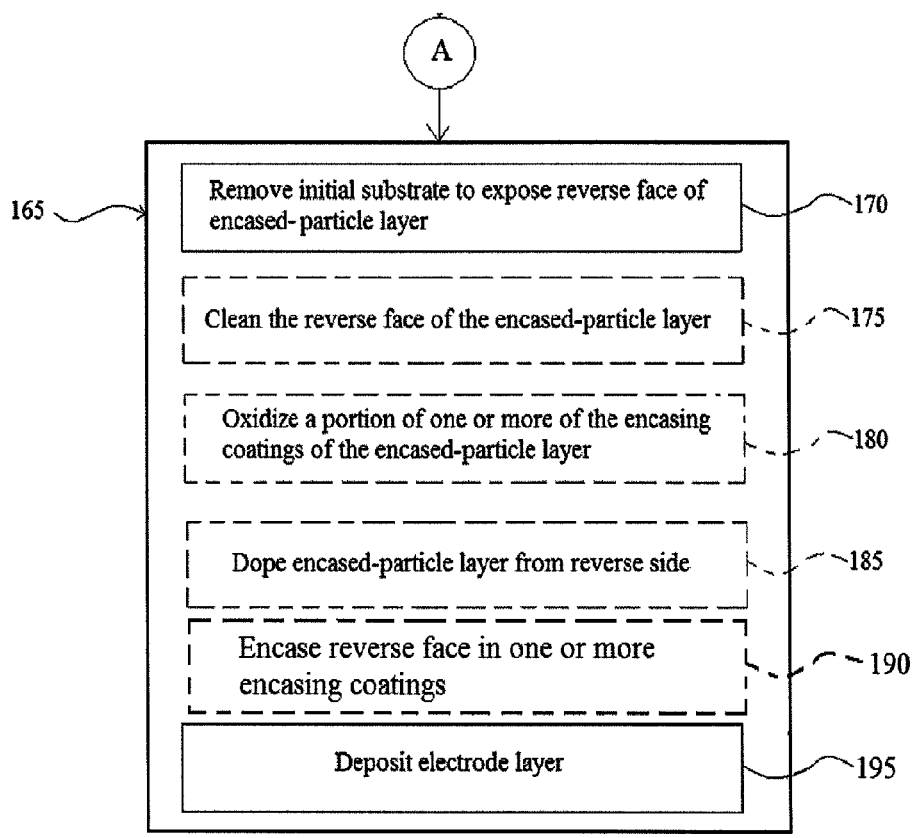

Referring now to the drawings, FIGS. 1A and 1B illustrate an exemplary method 100 of fabricating one or more optoelectronic devices having a monolayer of semiconductor particles as an optoelectrically functional element of the device. As is clear, the term "monolayer" implies a layer that is composed substantially of a single layer of particles, with little or no vertical stacking of particles. Furthermore, the term "monolayer" also implies that the particles within the layer are adjacent and proximate to one another preferably, although not necessarily, spaced apart from one another.

At a high level, method 100 begins at step 105 by providing a substrate onto which the monolayer of semiconductor particles is deposited, as described below. While this disclosure does not present the substrate as being incorporated into the final device, it should be understood that some alternative processes may do so without departing from various teachings herein. Examples of factors that may guide the choice of the substrate include, but are not limited to, cost, manufacturability, surface smoothness, durability, optical properties, electrical properties, solubility, removability, surface tension, rigidity, flexibility, fracture toughness, and other factors well known to those skilled in the art. Some specific types of material that can be used include, but are not limited to, ceramics, metals, glasses, polymers, semiconductors, insulators, conductors, metal oxides, metal carbides, metal nitrides, metal oxynitrides, metal oxyborides, and combinations thereof. More specifically, examples of substrates include, but are not limited to, silicon wafers, display-industry glass, niobium, nickel, zinc, metal alloys, silicon oxide, aluminum oxide, titanium oxide, nickel oxide, silicon nitride, aluminum nitride, nickel nitride, boron carbide, tungsten carbide, silicon carbide, silicon, germanium, aluminum oxynitride, silicon oxynitride, polyethylene terephthalate, polyethylene, polyethylene naphthalate, urethanes, polyamides, polyimides, polycarbonate, silicone, siloxanes, polyimide-silicon composite, and combinations thereof. Indeed, those skilled in the art will appreciate that these are but a small selection of the possible materials that can be used for the substrate at step 105 of method 100.

After providing the substrate at step 105, method 100 proceeds to step 110, in which a low surface energy non-stick layer can optionally be applied to the surface of the substrate. The function of the non-stick layer applied at optional step 110 includes, through its low-surface energy quality, facilitating the removal of the substrate from the applied monolayer of semiconductor particles, as discussed below. The low surface energy non-stick layer can be chosen in coordination with the monolayer deposition technique, described below, so as to arrive at a combination that further facilitates separation of substrate from the monolayer.

The non-stick layer can derive its non-stick/low surface energy quality using any of a variety of mechanisms. For example, the non-stick layer can derive its non-stick characteristics by being fabricated from a low surface energy material. In other examples, the non-stick layer can derive its non-stick characteristics through a surface pattern that has the ability to reduce the surface energy of the surface on which it is disposed (popularly known as the "Lotus Effect"). In yet other examples, the non-stick layer can be both fabricated out of a low surface energy material and have a non-stick surface pattern. Examples of low surface energy materials include, but are not limited to, fluoropolymers such as polytetrafluoroethylene, amorphous fluoropolymers, fluorinated silane-based polymers and monomers, diamond layers, diamond-like carbon, graphite, nanocomposite coatings of tungsten carbide, tungsten disulfide, hydrogenated amorphous carbon, molybdenum disulfide, and others. More examples of low surface energy materials can be found in the '872 application at pages 12 to 14, and are incorporated by reference herein. These low surface energy materials can also be fabricated so as to include a low surface energy surface pattern. Those skilled in the art will appreciate these are only a few examples of the mechanisms and materials that can be used to optionally reduce the surface energy of substrate.

Continuing with method 100, at step 115 a monolayer of semiconducting particles is applied to substrate. The monolayer deposited at step 115 will, as mentioned previously, form a functional element within the optoelectronic device. Before presenting several exemplary methods that can be used to apply the monolayer, it should be noted that the method used to deposit the particles depends on whether the particles are fabricated ex situ or fabricated in situ directly on the surface of the substrate. Such methods and some of the many possible variants of the particles are discussed below.

While three methods of depositing the monolayer using ex situ fabricated particles will be presented below in the context of FIGS. 2 through 8C, other well known techniques can be used to fabricate the particles and deposit them on the substrate. Ex situ fabrication methods include, for example, ball milling, grinding, sieving, and other powder processing techniques known to those skilled in the art. Deposition techniques of ex-situ fabricated particles include spin coating, spray coating, ink jet processes, powder jet processes, laser reactive deposition, Langmuir-Blodgett processes, Dynamic Surface Tension processes or their variants, including the processes as described in U.S. Pat. No. 7,763,310, "METHOD AND APPARATUS FOR THIN FILM/LAYER FABRICATION AND DEPOSITION," filed Jan. 12, 2009, and found at columns 2-5, and U.S. Pat. No. 7,241,341, "METHOD AND APPARATUS FOR TWO DIMENSIONAL ASSEMBLY OF PARTICLES," filed Nov. 5, 2004, and found at columns 3 to 6, both of which are incorporated by reference herein. Other techniques well known in the art include Schneider-Picard processes, wet electrostatic transfer, dry electrostatic transfer, plasma thermal spray, and other processes well known to those skilled in the art.

In addition to the above presented ex situ particle fabrication and deposition methods, step 115 can be accomplished by fabricating the particles in situ, directly on the substrate. Methods of in-situ fabrication include, for example, sol gel processing, nucleation and growth processing, and other in situ reaction methods. For either in situ or ex situ processing, the particles forming the monolayer can be polycrystalline, mono-crystalline, micro-crystalline, nano-crystalline, or amorphous. Those skilled in the art will appreciate that the desired size and crystallographic properties of the particles can depend on the processing method chosen. For example, sol gel processing can produce micro- or nano-crystals having a few crystals, or even a single crystal, per particle, whereas grinding can produce a population of particles having a normally distributed size frequency with a mean size more likely to be in the micro-crystal range, or larger, wherein each particle can have many crystals. As those skilled in the art will appreciate, the processing parameters of all the foregoing processes can be manipulated so as to produce a desired particle size distribution having the desired crystalline characteristics.

Furthermore, the particles used to form the monolayer can be of any shape and still function as the optoelectronic layer in the device. For example, a particle used in forming the monolayer can be spherical, spheroid, oblate, plate-like, cuboid, other approximately geometric shapes, as well as non-uniform shapes that cannot be categorized using geometric classifications for regular shapes. Also, a particle used to form the monolayer can have a characteristic dimension (e.g., an approximate diameter, side length, or bisecting segment) of from less than approximately 10 nm to several hundred microns or more and still function within the monolayer. While there is fundamentally no upper limit to the characteristic dimension of the particle, generally particles will have a characteristic dimension of less than about 100 microns.

Either before or after depositing the monolayer, the crystal structure of the particles can be modified through recrystallization of the particles. For example, recrystallization can reduce the number of grain boundaries within each particle thereby improving charge carrier mobility within the semiconductor particles individually and the monolayer as a whole. Example techniques that can be used to recrystallize the particles include, but are not limited to, rapid thermal annealing, rapid thermal processing, furnace annealing, argon ion laser annealing, excimer laser annealing, phase modulated ELA, metal induced crystallization, and others techniques well known to those skilled in the art.

Continuing with FIG. 1A, in this example an optional particle processing meta-step 120 includes three optional processing steps that may or may not be performed. If one or more of these optional steps are performed, they may be performed in any order and in any combination. For example, at optional step 125 the particles forming the monolayer deposited at step 115 are dispersed to facilitate an approximately uniform separation of the particles from one another. This approximately uniform separation can improve the optoelectronic performance of the monolayer by reducing the amount of particle-particle contact, which in turn increases the fraction of surface area that can emit light, in the case of an LED, or receive photons, in the case of a solar cell. Those skilled in the art will appreciate the many advantages that can follow uniform separation between the particles of the monolayer in addition to those disclosed here.

One exemplary technique that can be used to disperse the particles at optional step 125 includes applying an electrostatic charge of the same polarity to the particles, thereby causing the particles to be repelled from one another. The charge can be applied electrostatically, or by ionizing the particles using, for example, an ionizing gun, or by charging both the particles and the substrate, or any combination thereof. Another technique that can be used to disperse the particles prior to or during deposition is by using physical means to maintain a separation between the particles as they are deposited. This technique includes using, for example, meshes, or sieves, to separate the particles during deposition. Another technique can texture the surface of the substrate to provide individual receiving locations for the particles, thereby maintaining a separation between them once they are deposited. A yet further technique includes uniformly dispersing the particles in a transfer medium, for example, liquid, polymeric, or gaseous mediums, and depositing the uniformly dispersed particles onto the substrate using molding, embossing, or printing. These are but a few examples of the myriad of techniques that can be used by the skilled artisan to deposit a monolayer of uniformly dispersed particles onto the reverse side substrate.

Another optional step within meta-step 120 is step 130. At step 130, the surface of the particles forming the monolayer are cleaned so as to remove native oxide and other impurities present on the particle surface and sub-surface. Cleaning techniques can also include, but are not limited to, wet chemical etching or dry etching. Dry etching techniques can include reactive ion etching, plasma enhanced etching, deep reactive ion etching, sputtering, high density plasma etching, laser ablation, and many others. Wet etching techniques can include using acidic or caustic etchants, solvents, high pressure fluids, and other wet etching techniques known to those skilled in the art. Indeed, those skilled in the art will recognize that these are but a small selection of techniques available to remove native oxide and other impurities and that other techniques are available even though not discussed here.

Another optional step within optional particle processing meta-step 120 is step 135. At step 135 the particles forming the monolayer are doped. As is well known, doping alters the electrical characteristics of the semiconductor by adding atoms that donate either electrons or holes, thereby forming an n-type or a p-type semiconductor, respectively. In other examples, because doping can be focused at a desired region or to a certain depth from the particle surface, a single particle can be doped with both n-type and p-type dopants. The purpose of this doping scheme will be described in more detail below. Doping techniques that can be used at step 135 are well known to those skilled in the art and include, but are not limited to, for example, diffusion or ion implantation of a desired n-type or p-type dopant species. Other techniques include depositing a dopant and subsequently activating it through rapid thermal annealing, furnace annealing, argon ion laser annealing, excimer laser annealing, and other known doping techniques.

After applying the monolayer of particles at step 115, and/or after optionally performing some or all of the steps within optional particle processing meta-step 120, method 100 may proceed to meta-step 140 at which the particles of the monolayer are encased in one or more coatings and the resulting encased-particle layer is optionally processed. At step 145 within meta-step 140, the particles of the monolayer are encased in one or more coatings to provide the encased particle layer. The coating(s) effectively bind the particles together so as to create the monolithic encased-particle layer, which includes the particles and the encasing coating(s). As will be seen below, the integrity of the encased-particle layer helps in holding the particles in place if/when the substrate is removed for further processing. The encasing coating(s) typically conform(s) to the surface of each particle as well as to the surface of the substrate that is unoccupied by the particles of the monolayer.

Depending on the material(s) used for the encasing coating(s), the encasing coating(s) can function to physically and electrically isolate conductive or semiconductive elements, such as the particles or portions thereof, so as to inhibit shorting. However, in other exemplary embodiments of different electrical designs, each encasing layer can be entirely conductive or have regions of differing conductivity. One technique of forming the encased-particle layer at step 145 includes depositing a metal layer that is then oxidized in situ from the reverse-side of the monolayer after removing the substrate, as described below. This metal oxide then provides physical and electrical isolation to inhibit shorting. Metals that can be deposited include aluminum, titanium, indium, tin, tantalum, zirconium, niobium, hafnium, yttrium, nickel, tungsten, chromium, zinc, and any alloys or combinations thereof.

Another technique of forming the encased-particle layer at step 145 is to deposit an electrical insulator material that conforms to the surface of the particles and the exposed surface of the substrate that is unoccupied by the particles of the monolayer. In some examples, a conformal oxide, nitride, oxynitride, oxyboride, carbide, cermet, or organic polymer layer can be deposited to provide the aforementioned electrical insulation. These materials include, but are not limited to silicon oxide, aluminum oxide, titanium oxide, indium oxide, tin oxide, tantalum oxide, zirconium oxide, niobium oxide, hafnium oxide, yttrium oxide, nickel oxide, tungsten oxide, chromium oxide, zinc oxide, aluminum nitride, silicon nitride, boron nitride, germanium nitride, chromium nitride, nickel nitride, gallium nitride, boron carbide, tungsten carbide, silicon carbide, aluminum oxynitride, silicon oxynitride, boron oxynitride, polyethlyene terephthalate (PET), polyethylene naphthalate (PEN), or high temperature polymers such as polyether sulfone (PES), polyimides, urethanes, polyamides, polyimides, polybutylenes, isobutylene isoprene, polyolefins, epoxies, parylene, benzocyclobutadiene, polynorbornenes, polyarylethers, polycarbonate, alkyds, polyaniline, ethylene vinyl acetate, and ethylene acrylic acid, (meth)acrylates, or combinations thereof. Those skilled in the art will appreciate that these are but a small selection of the conformal, electrically insulating layers that can be deposited to insulate the particles of the monolayer, or portions thereof, from each other.

Continuing with step 145, the encasing coating(s) can be provided in any number of ways that encase the particles forming the monolayer. These techniques include physical vapor deposition, electron beam deposition, sputtering, bias sputtering, chemical vapor deposition, dip plating electroplating, Langmuir-Blodgett deposition, spin coating, spray coating, and many others well known to those skilled in the art.

In addition to step 145, meta-step 140 can include one or more optional steps for processing the encased-particle layer. The need/desire for such optional step(s) will typically depend on the nature of the encasing coating(s) used to encase the particles at step 145. For example, at optional step 150 of meta-step 140, the encasing coating(s) of the encased-particle layer is/are re-crystallized. Re-crystallization can, for example, reduce the number of grain boundaries within the encasing coating(s), thereby improving charge carrier mobility. Example techniques that can be used to re-crystallize the coating(s) include, but are not limited to, rapid thermal annealing, rapid thermal processing, furnace annealing, argon ion laser annealing, excimer laser annealing, phase modulated ELA, metal induced crystallization, and others techniques well known to those skilled in the art.

Another optional step of meta-step 140 is illustrated at step 155, wherein the encased-particle layer is doped or partially doped. This doping can provide another optoelectrically active region in addition to the monolayer thereby improving the optoelectronic activity of the device. In some examples, only the upper surface region of the encased-particle layer is doped, while in other examples a sub-surface band, that excludes the surface layer, is doped. In yet other examples, the entire thickness of the encased-particle layer is doped. Any of the above doping schemes can be selected to meet a desired performance objective. Furthermore, any of the above doping schemes can be accomplished using techniques presented above, as well as others known to those skilled in the art.

Proceeding from meta-step 140, at optional step 160 one or more additional layers are provided. One example of such additional layers is an electrode layer that is conformally deposited over encased-particle layer to facilitate electrical contact with one or more elements external to the fabricated device, such as an electrical conductor of a circuit (not shown) of which a finished optoelectronic device will be a part. The electrode can be deposited in direct contact with the encased-particle layer, for example as an Ohmic contact, or alternatively, it can be deposited after providing one or more other layers that separate it from the encased-particle layer. In some examples, the electrode layer is an opaque conductor, such as gold, silver, copper, aluminum, or any other opaque conductor known to those skilled in the art. In other examples, the layer is a transparent conductor to facilitate, for example, the transmission of light. Transparent conductor materials can include, but are not limited to, ZnO, In2O3, indium tin oxide, Ga2O3, CdO, PbO2, InGaZnO, zinc indium tin oxide, nickel oxide, rhodium oxide, iridium oxide, copper oxide, cobalt oxide, tungsten oxide, titanium nitride, niobium nitride, tungsten nitride, tin oxy-nitride, palladium oxy-nitride, and many others. Organic conductive layers can also be used in this application, and can be deposited using techniques well known to those skilled in the art, including those presented above.

Another example of a layer that can be deposited at optional step 160 is a substrate layer. As will become evident from reading this entire disclosure, such a substrate layer can facilitate further processing, such as the reverse-side processing that occurs at meta-step 165. In that case, the substrate layer provides support to the encased-particle layer, for example, to facilitate handling in subsequent processing and to maintain the integrity of the encased-particle layer and any other layers provided over the encased-particle layer at step 160, if any. The substrate layer can be virtually any layer that provides the required support and can be provided in any suitable manner commensurate with the material selected. For example, if the substrate layer is made of a preformed substrate, it can be coupled to the encased-particle layer by bonding. As another example, if the substrate layer is made of a flowable material that is subsequently cured, such as polyimide, it could be applied by spin coating. Those skilled in the art will readily appreciate that these are mere examples and should not be considered limiting in any way.

As mentioned above, meta-step 165 involves reverse-side processing, i.e., processing that occurs on the side of the encased particle layer that confronts the original substrate. In this example, meta-step 165 includes six steps, at least four of which are optional. At step 170 of meta-step 165 the original substrate is removed to expose the "reverse-face" of the encased-particle layer that includes the semiconductor particles in the monolayer that was applied at step 115. Substrate-removal step 170 enables subsequent processing of the encased-particle layer from its now-exposed reverse-face, as will be explained in more detail below.

Removal of the substrate at step 170 can be accomplished using one or more of many techniques. One technique can include applying a mechanical stress, in the form of a tensile stress, a shear stress, or a combination of both. Another technique can include using a chemical agent to change the surface energy of either the substrate or the monolayer, thereby facilitating removal of the substrate. Other chemical agents can be used to introduce mechanical stresses between the substrate and the monolayer through a phase change or by weakening the bond at the interface by etching, dissolving, or otherwise attacking the substrate proximate the monolayer. Those skilled in the art will appreciate that many other methods of separating the substrate from the monolayer are well known, and that those recited are for illustration only. Furthermore, a skilled artisan will appreciate that the depiction of meta-step 140 and meta-step 160 do not limit the number or type of steps that can be included within either of the meta-steps.

After removing the initial substrate at step 170, one or more additional reverse-side processing steps can be performed at meta-step 165. Depending on the technique used to remove the substrate, one reverse-side processing step that may need to be performed is step 175 at which the reverse-face of the encased-particle layer is cleaned. Some examples of methods used to clean the surface layer can include, but are not limited to, those previously described above in the context of meta-step 120. As another example of reverse-side processing, as mentioned above one type of anti-shorting layer that can be provided includes applying a conformal metal coating as an encasing layer at step 145 and then oxidizing a portion of that coating from the reverse-face of the encased-particle layer after the initial substrate has been removed. Consequently, another optional step that can be performed at meta-step 165 is step 180 at which a portion of an encasing metal coating is oxidized. An example of step 180 is described below in connection with FIGS. 8 and 9A-9I.

At another optional step, step 185, the encased-particle layer is doped or partially doped from the reverse-side face exposed at step 170 if doping produces the desired electrical characteristics and the particles have not already been so doped ex situ. As explained above in the context of step 135, doping techniques include diffusion and ion implantation of a desired n-type or p-type dopant species. Other techniques include depositing a dopant and subsequently activating it through rapid thermal annealing, furnace annealing, argon ion laser annealing, excimer laser annealing, and yet other known doping techniques. Those skilled in the art will appreciate that the techniques listed are but a small selection of the possible doping techniques known.

At optional step 190, performed within meta-step 165, the reverse face of the monolayer of semiconductor particles deposited at step 115, and subsequently exposed at step 170, can be encased in one or more encasing coatings. As explained in the context of step 145, the need/desire for such optional step(s) will typically depend on the nature of the encasing coating(s) used to encase the particles. In some examples, in addition to the factors explained above, the encasing coating(s) deposited at optional step 190 can be selected to complement, or operate in cooperation with, the coating(s) deposited at step 145. Furthermore, in other examples, the coating(s) deposited at step 190 can include one or more quantum confinement coating(s), depending on the device architecture.

Meta-step 165 can also include a step 195 at which an electrode layer is deposited. The electrode layer is deposited to facilitate electrical coupling between the functional monolayer and one or more elements external to the fabricated device, such as an electrical conductor of a circuit (not shown) of which the finished optoelectronic device made using method 100 will be a part. The electrode can be deposited directly in contact with the reverse-face of the encased-particle layer, such as an Ohmic contact, or it can be deposited proximate to the monolayer, separated from the monolayer by other layers, as long as the electrode and the monolayer are in electrical communication. In this example, the electrode layer is a transparent conductor that, in addition to facilitating electrical contact, facilitates the transmission of light from or to the monolayer. Transparent conductor materials can include, but are not limited to, ZnO, In2O3, indium tin oxide, Ga2O3, CdO, PbO2, InGaZnO, zinc indium tin oxide, nickel oxide, rhodium oxide, iridium oxide, copper oxide, cobalt oxide, tungsten oxide, titanium nitride, niobium nitride, tungsten nitride, tin oxy-nitride, palladium oxy-nitride, and many others. Organic conductors can also be used and can be deposited using techniques well known to those skilled in the art, including those presented above.

Those skilled in the art will appreciated that the meta-steps 120, 140, and 165 can include other steps not described without departing from the broad teachings of the present disclosure. For example, one or more quantum confinement layers and/or other layer may be applied at a convenient point within meta-step 140 or meta-step 165, depending upon the type of device being fabricated using method 100. Because such additional steps are many and various, for clarity they have been omitted from FIGS. 1A and 1B. That said, a number of these additional steps are addressed below in specific examples.

Methods of Depositing a Monolayer

Before proceeding with specific examples, following are some novel methods for providing the monolayer at step 115 that are in addition to those known techniques discussed above. One such novel method, method 200, is presented in FIG. 2, and a corresponding exemplary embodiment is shown in FIGS. 3A-3E.

Figure 2:
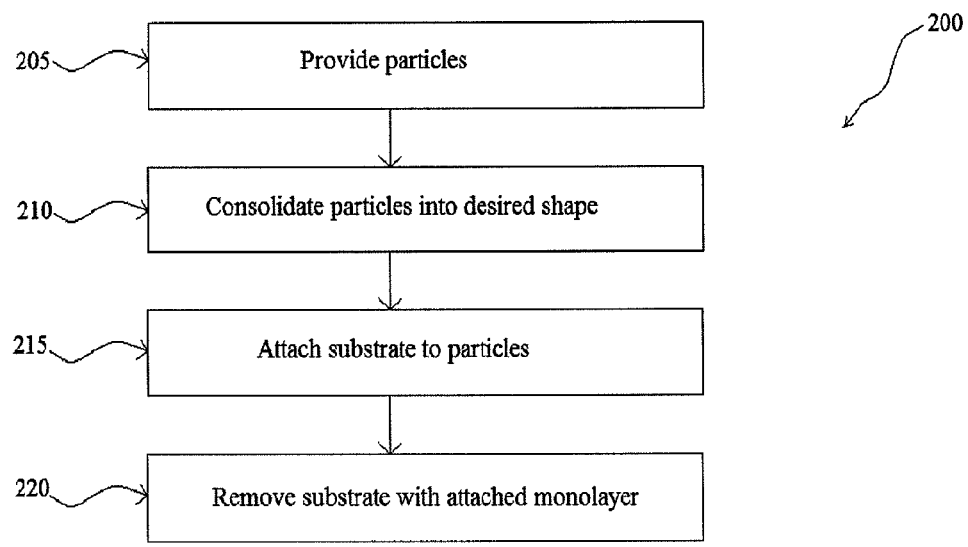
FIG. 2 is a flow diagram of an embodiment of a novel method of providing a monolayer to a substrate using particles consolidated into a desired shape.
Figure 3A:
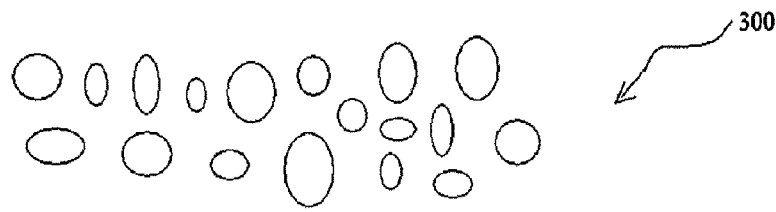
FIGS. 3A-3E are diagrams illustrating various steps of the method of FIG. 2.

Referring now to FIGS. 3A-3E, and also to FIG. 2, method 200 begins at step 205 at which doped or undoped ex situ fabricated semiconductor particles 300 are provided (FIG. 3A). Fundamentally, particles 300 provided can have any shape, size distribution, characteristic dimension, chemical composition, and electrical property, as described above. Furthermore, particles 300 can be provided as the result of any one of many different types of synthesis methods, some of which were described above in the context of FIGS. 1A and 1B. However, as those skilled in the art will appreciate and as was described above, the previously described synthesis methods are merely examples and do not limit the teachings of the present disclosure.

Figure 3B:
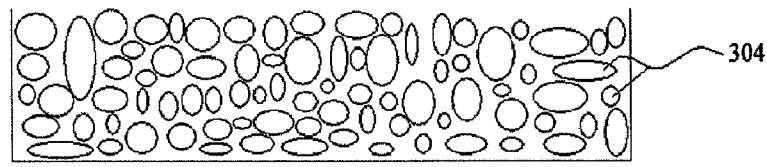

At step 210, and with reference to FIG. 3B, particles 300 are consolidated and formed into a desired shape 304 that can, for example, approximate the profile or outer dimensions of the monolayer or the device to be fabricated. Those skilled in the art will appreciate that there is fundamentally no limitation to desired shape 304, which can be designed to facilitate layer removal, device fabrication, light emission, light absorption, optoelectrical performance, mass production of a plurality of devices, and many other design features. There are also few limitations on the methods that can be used to form particles 300 into desired shape 304. These methods are also well known in the art and can include hot isostatic pressing, electron consolidation, repeated omnidirectional compaction, hydrostatic pressing, and others. Those skilled in the art will appreciate that other techniques can be used to form particles 300 into desired shape 304 without departing from the teachings of the present disclosure.

Figure 3C:
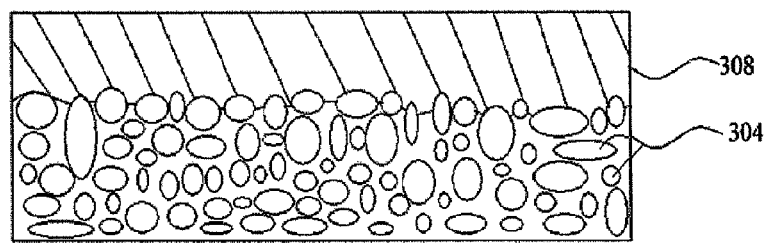
Figure 3D:
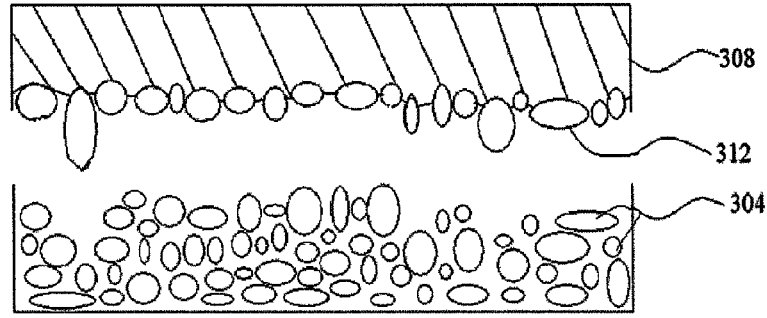

At step 215, desired shape 304 is attached to a substrate 308 (FIG. 3C). Techniques that can be used to attach the formed particles to a substrate can include spin coating on an organic monomer layer and initiating a reaction so as to polymerize it, or spin coating on a polymer layer that, in some examples, cures or hardens. In other examples, substrate 308 that is already solidified can be attached to desired shape 304 using pressure, heat, adhesives, or any combination thereof. Those skilled in the art will recognize that many other techniques for attaching the formed shape of particles to the substrate are possible and can be applied at step 215 without departing from the teachings of the present disclosure.

Figure 3E:
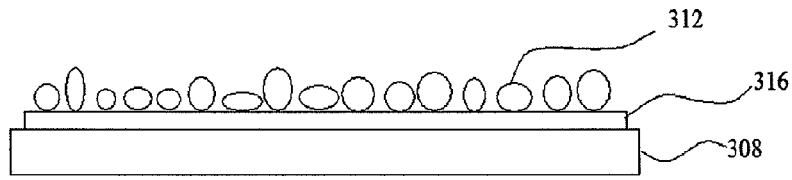

Proceeding to step 220 of method 200, substrate 308 is removed from desired shape 304 (FIG. 3D), thereby also removing a monolayer of particles 312 that remains attached to the substrate. Monolayer 312 attached to substrate 308 can then be included as an optoelectronic element in an optoelectronic device consistent with the discussion presented above and in connection with FIGS. 1A and 1B. Another embodiment of monolayer 312 is shown in FIG. 3E, in which a low surface energy non-stick layer 316 is disposed between monolayer 312 and substrate 308 to facilitate future removal of the monolayer from the substrate, as described above in the contexts of FIGS. 1A and 1B.

Figure 4:
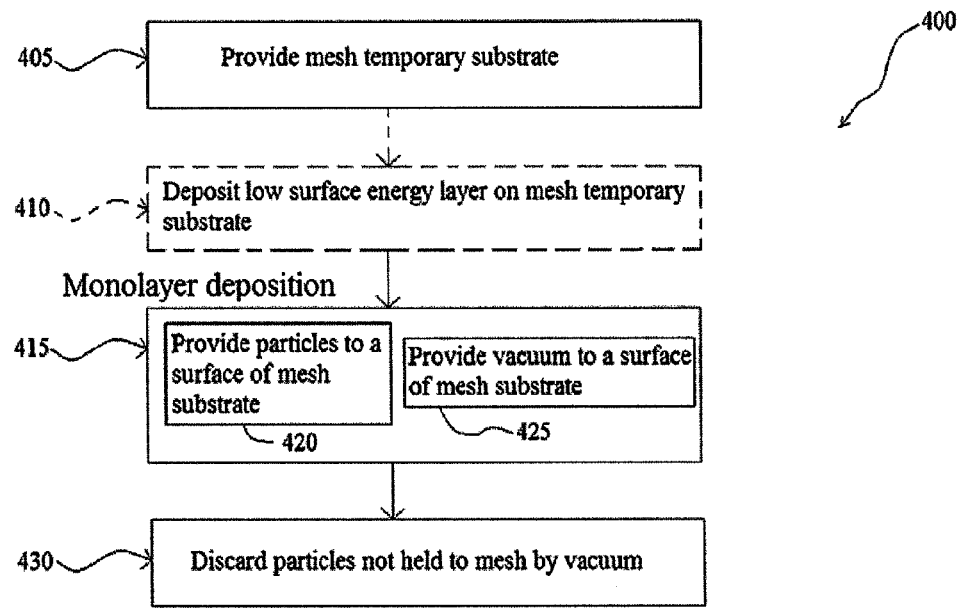
FIG. 4 is a flow diagram of an embodiment of another novel method of providing a monolayer to a substrate using a temporary mesh substrate.
Figure 5A:
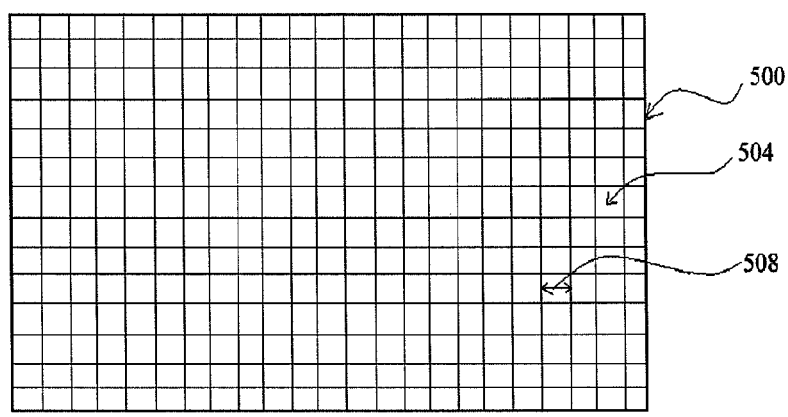
FIGS. 5A-5E are diagrams illustrating various steps of the method of FIG. 4.
Figure 5B:
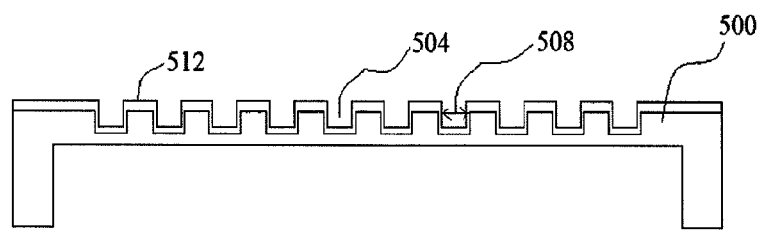
Figure 5C:
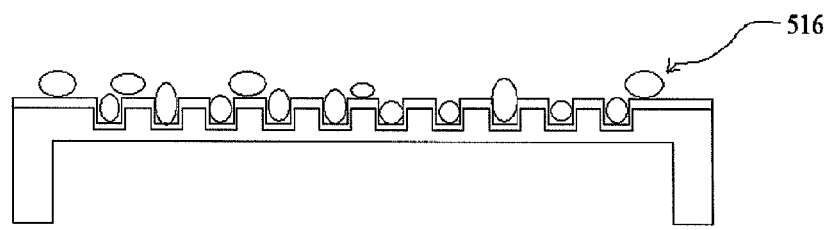
Figure 5D:
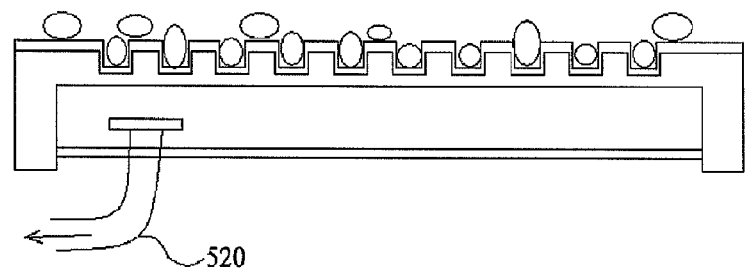
Figure 5E:
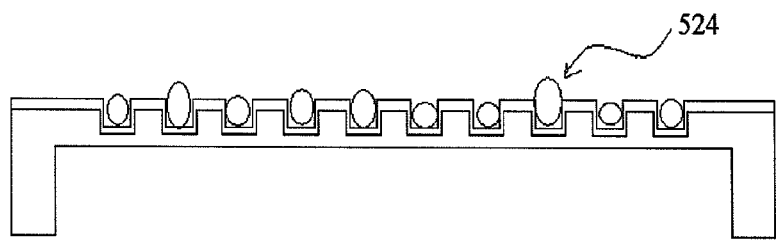

Another novel method of providing the monolayer at step 115 is depicted by method 400 in FIG. 4 and is described with concurrent reference to FIGS. 5A-5E for supporting diagrams. Method 400 utilizes a mesh substrate 500 (FIG. 5A) that is provided at step 405 and has holes 504 that are characterized by a characteristic dimension 508 sized to be slightly smaller than the mean characteristic dimension of the particles that will form the monolayer. For example, if the particles are approximately spherical and have a mean diameter of 10 microns, then characteristic dimension 508 can be slightly less than approximately 10 microns. In another example, characteristic dimension 508 can be selected so as to be anywhere within the upper and lower limits of a particle size distribution of a given population of particles. In this example, appropriately sized particles will naturally lodge in holes 504. Those skilled in the art will appreciate that there are many possible methods of fabrication for mesh substrate 500, and many possible shapes and characteristic dimensions 508 possible for holes 504. Furthermore, those skilled in the art will appreciate that there are many methods by which to select particle population size distribution and characteristic dimension 508 such that particles lodge within holes 504.

At optional step 410, a low surface energy non-stick layer 512 (FIG. 5B) can be applied to mesh 500. In some examples, low surface energy non-stick layer 512 can be a layer of hexagonal boron nitride. In other examples, non-stick layer 512 can be polytetrafluoroethylene or silane. In yet other examples, non-stick layer 512 can be one of any of the above described low energy non-stick layers presented in the context of FIGS. 1A and 1B. Those skilled in the art will appreciate the many compositions and structures available for non-stick layer 512 that can be selected without departing from the broad teachings of the present disclosure.

With continuing reference to FIG. 4, once mesh 500 has been provided at step 405, a monolayer 524 can be provided at a monolayer deposition meta-step 415. Within meta-step 415 are step 420 and step 425, which can be used to releasably secure a monolayer of particles to a substrate and which can be accomplished in any order relative to each other. For example, at step 420, plurality of particles 516 (FIG. 5C) can be provided to mesh substrate 500. Then, at step 425, a vacuum 520 (FIG. 5D) can be applied to mesh substrate 500 and plurality of particles 516 so as to releaseably secure some of the plurality of particles within holes 504. In another example, vacuum 520 is applied before plurality of particles 516 is provided to mesh 500. In either case, the result of releaseably securing some of the particles to mesh 500 is accomplished independently of the order.

At step 430, particles not secured to mesh substrate 500 by vacuum 520 are removed from the mesh substrate leaving monolayer 524 (FIG. 5E) disposed within holes 504. The unsecured particles can be removed using any of a number of techniques including ultrasonic vibration, non-ultrasonic vibration, high pressure fluid, solvents, compressed air, or inversion of mesh 500. Those skilled in the art will appreciate the many methods that can be used to remove the unsecured particles.

Figure 6:
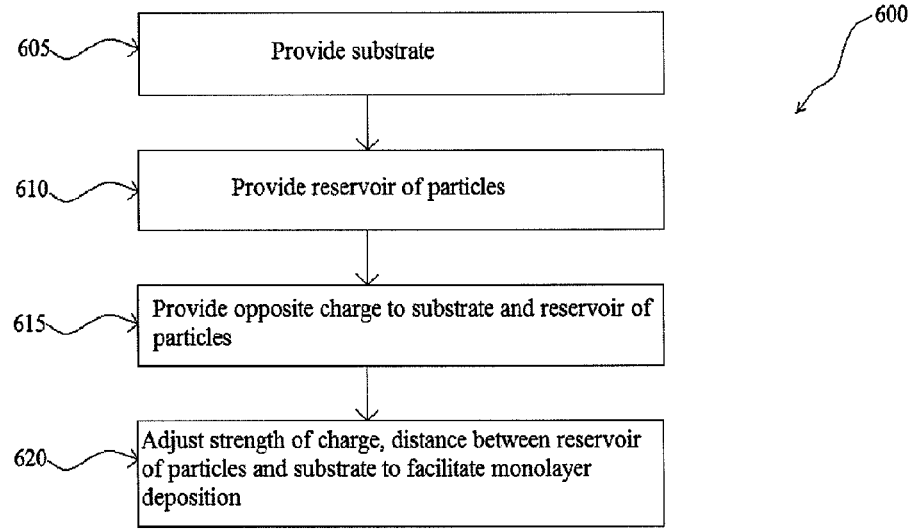
FIG. 6 is a flow diagram of an embodiment of yet another novel method of providing a monolayer to a substrate using electrostatic deposition.
Figure 7A:
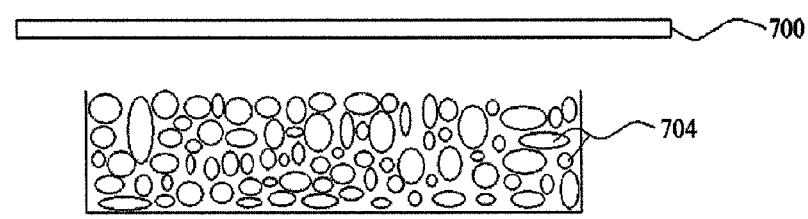
FIGS. 7A-7C are diagrams illustrating various steps of the method of FIG. 6.
Figure 7B:
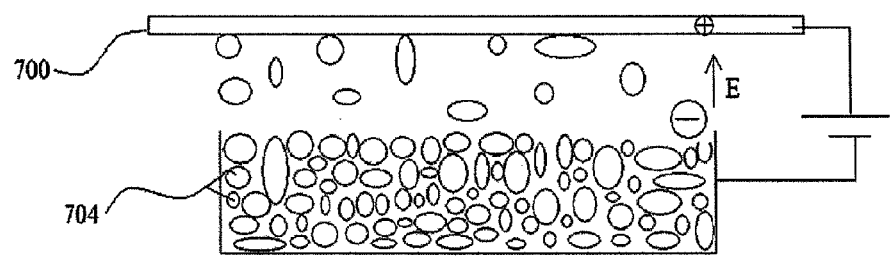
Figure 7C:
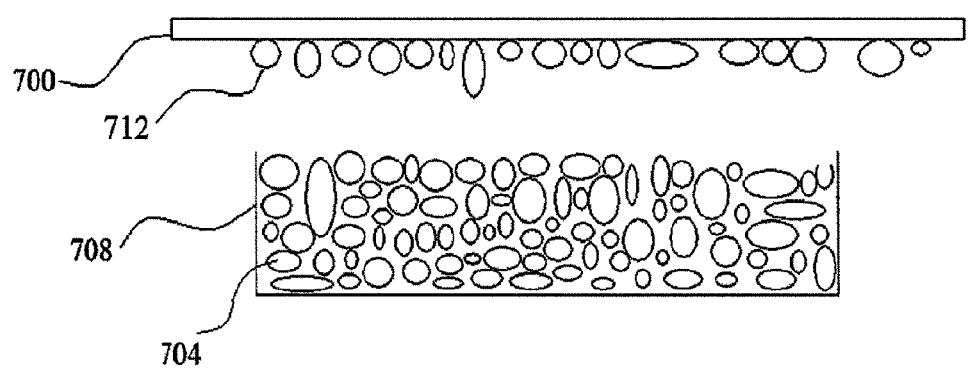

A third novel method of providing the monolayer at step 115 using electrostatics is depicted by method 600 in FIG. 6 and is described with concurrent reference to FIGS. 7A-7C for supporting diagrams. At step 605, depicted in FIG. 7A, a substrate 700 is provided and, at step 610, plurality of particles 704 are provided and placed proximate to the substrate. At step 615 opposite electrical polarities are applied to substrate 700 and particles 704 thereby provide an electrostatic potential to move the particles to the surface of the substrate (FIG. 7B). Particles 704 may be provided within a container 708 or not within the container. If particles 704 are provided within container 708, then the container or the particles can be charged with a polarity opposite that of substrate 700. However, if particles 704 are not provided within container 708, then the particles can themselves be charged to facilitate transport to substrate 700. At step 620, the various electrostatic parameters, including electric field strength, distance between substrate 700 and particles 704, charge polarity, charge density, current, voltage, and other parameters, are varied so as to deposit only a monolayer 712 onto substrate 700 (FIG. 7C). Those skilled in the art will appreciate the variety of parameters and parameter values that can be adjusted so as to deposit only a monolayer of particles on the surface of substrate 700. Also, while method 600 contemplates dry electrostatic deposition of monolayer 712, wet electrostatic deposition, can also be used to deposit the monolayer.

The three foregoing novel monolayer deposition methods can be applied in conjunction with, for example although not necessarily, method 100 in order to fabricate an optoelectronic device. Furthermore, these three methods may be used in conjunction with the methods described below to fabricate the example devices presented below. It will be understood that these three novel methods can also be applied to the fabrication of devices not expressly recited but known to those skilled in the art without departing from the broad teachings of the present disclosure.

Detailed Example of Optoelectronic Device Fabrication

Figure 8B:
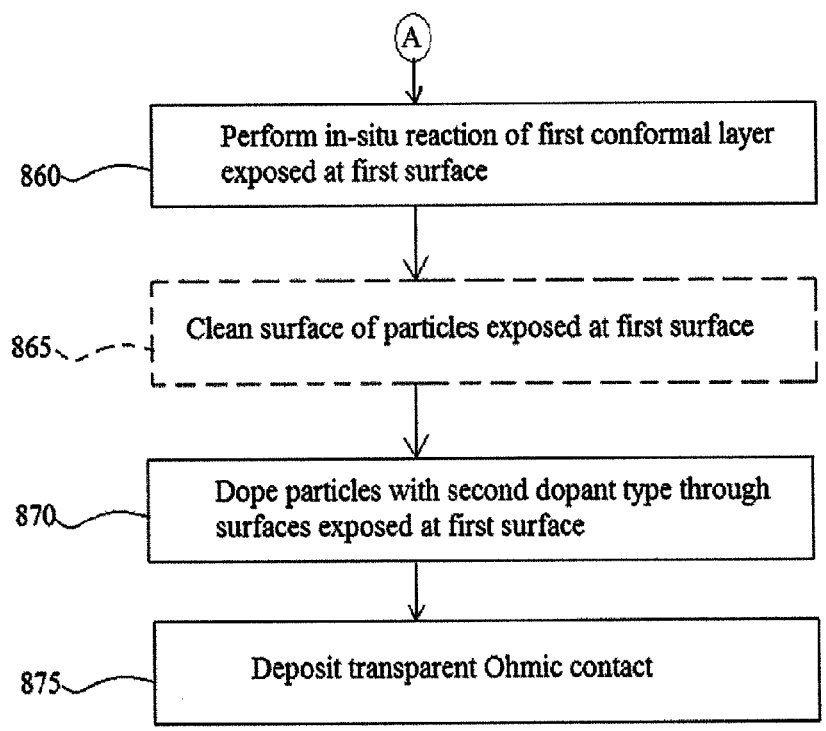

As presented above, a monolayer of semiconductor particles can be incorporated into a device/circuit using, for example, method 100 of FIGS. 1A and 1B. As a particular example, FIGS. 8A and 8B illustrate a method 800 that utilizes various steps of method 100 to form an optoelectronic device 900 (FIG. 9I) having a monolayer 912 of semiconducting particles 912A, wherein each particle in the monolayer contains a p-n junction. As will become apparent from reading on, the steps of method 800 need not necessarily be performed in the order presented to achieve an equivalent result. Furthermore, those skilled in the art will appreciate that many similar devices, including PIN junction based devices, quantum confinement-based devices, heterojunction based devices, and others can be fabricated using various ones of the steps presented.

Figure 9A:
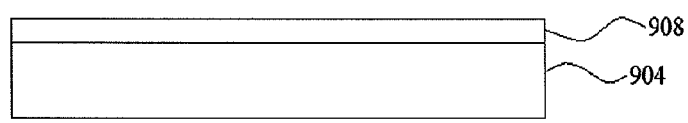
FIGS. 9A-9I are diagrams illustrating various steps of the method of FIG. 8.
Figure 9B:
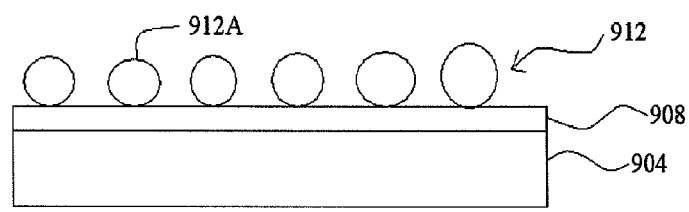
Figure 9C:
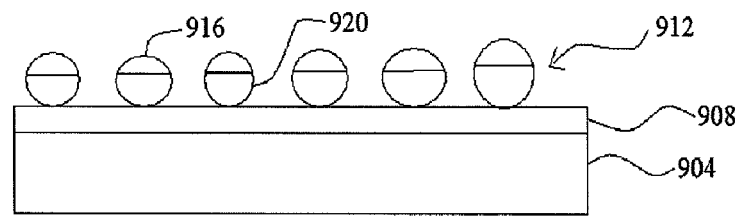
Figure 9D:
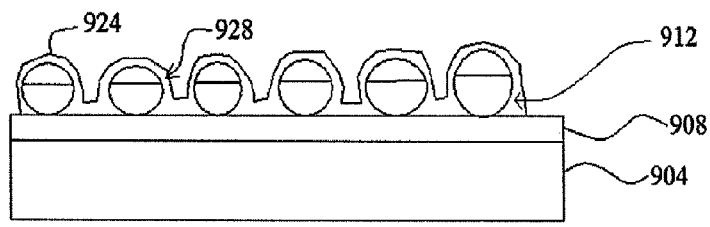
Figure 9E:
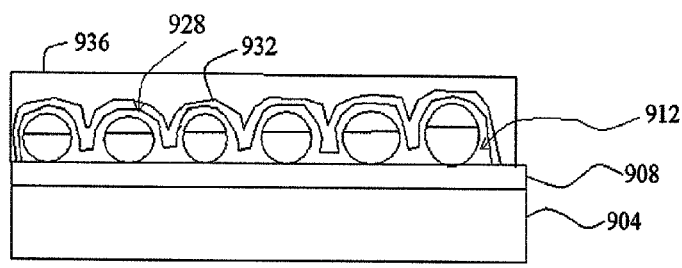
Figure 9F:
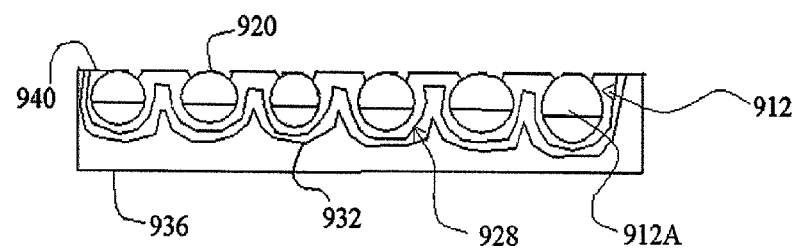
Figure 9G:
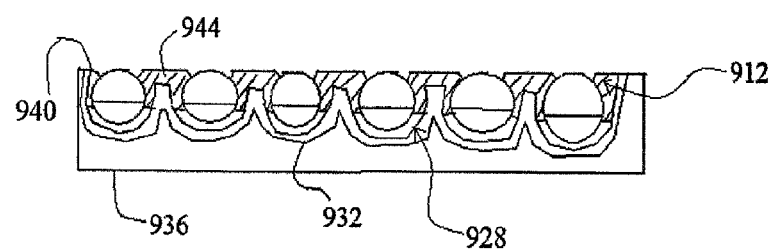
Figure 9H:
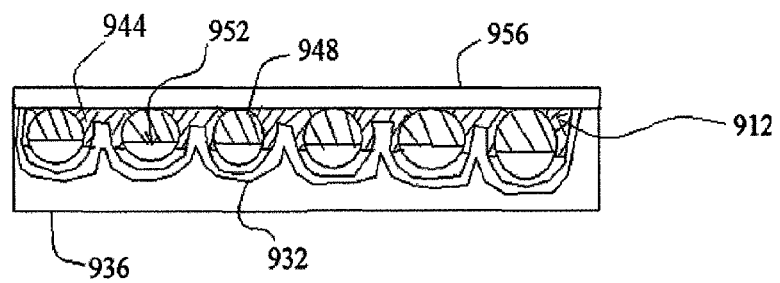
Figure 9I:
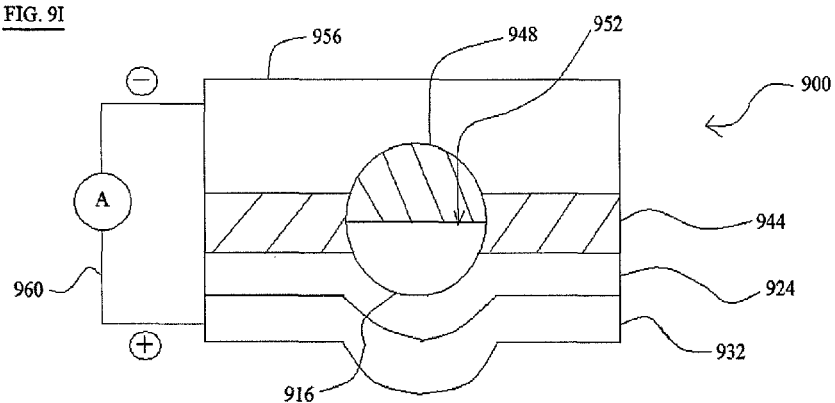

Referring now to FIGS. 9A-9I, and also to FIGS. 8A and 8B, method 800 of FIG. 8A begins at step 805 by providing a temporary substrate 904 (FIG. 9A) based on factors and criteria discussed elsewhere in this disclosure. Temporary substrate 904 is used in this example as a starting point on which to deposit the layers that will ultimately form the optoelectronic device using monolayer 912 of semiconductor particles 912A as a functional element of device 900 (FIG. 9I).

At optional step 810, temporary substrate 904 is coated with a low surface energy non-stick layer 908, as disclosed above. Non-stick layer 908 can facilitate the removal of temporary substrate 904, which in turn, facilitates access to the reverse side of monolayer 912 for reasons discussed above and evident from additional details presented below. In this example, non-stick layer 908 is hexagonal boron nitride, but other materials, such as those discussed above or well known to those skilled in the art, can be used to form the non-stick layer.

At a particle deposition meta-step 815, at least three steps relating to the deposition of the monolayer 912 can be performed in any order. For example, at step 820 of meta-step 815, monolayer 912 can be deposited on temporary substrate 904 (FIG. 9B) using any of the deposition techniques described above in the present disclosure or any other technique known to those skilled in the art. In this example, monolayer 912 is deposited using a dynamic surface tension process as disclosed in U.S. Pat. Nos. 7,763,310 and 7,241, 341 as cited above. Furthermore, in this example the particles 912A forming monolayer 912 are approximately spherical and approximately 20 microns to approximately 30 microns in diameter, although as described previously, and as will be appreciated by those skilled in the art, any size or shape of particle can be used without departing from the teachings of the present disclosure.

At optional step 825 within meta-step 815, a dispersant can be applied to particles 912A to assist in their separation from each other. By separating particles 912A from one another, the exposed surface area of the particles is increased, thereby improving the optoelectronic efficiency of monolayer 912 and the optoelectronic device incorporating the monolayer. The materials and methods for dispersing particles have been described elsewhere within this disclosure and need no further description in the context of this step for those skilled in the art to fully understand this aspect of method 800.

At step 830 within meta-step 815, the exposed surface of particles 912A forming monolayer 912 can be cleaned, for example, using a reactive ion etch. Cleaning step 830 removes impurities, or native oxides, or both, that can reside on the surface of the particles or at a sub-surface layer. Furthermore, depending on the treatment used, this step can also passivate the surface of the particles by providing reactants that bond with dangling bonds on the surface of the semiconductor particles. While a reactive ion etch is used in this example, other cleaning techniques, including those presented above, are equally applicable. Those techniques not presented above but known to those skilled in the art are equally applicable to this step.

At step 835, a top portion of the particles 912A constituting monolayer 912 is doped with, in this example, a p-type dopant to form p-type doped portion 916, as shown in FIG. 9C. As is evident from FIG. 9C, p-type doped portion 916 extends only to part of the exposed particle, leaving an undoped portion 920 opposite, but adjacent to, the doped portion. While in FIG. 9C doped portion 916 and undoped portion 920 bisect the particles, these two portions need not be equal. As can be appreciated by those skilled in the art, there is no need for the portions to be equal, and furthermore, natural variation in processing will produce particle-to-particle differences in the level of doped portion 916.

Proceeding to step 840 of method 800, a particle-encasing coating 924 is applied over monolayer 912 (FIG. 9D) to form an encased-particle layer 928. Coating 924 serves at least two functions. One such function is to provide Ohmic contact to p-type doped portion 916, thereby facilitating electrical contact with other elements of an optoelectronic device (not shown) or a circuit (not shown) containing the optoelectronic device. Another function of encased-particle layer 924 is to provide a layer that, in addition to providing Ohmic contact, can also be oxidized at a desired location which thereby electrically insulates particles 912A forming monolayer 912 from each other. This will be shown in more detail at step 860 and FIG. 9G. This electrical insulation improves the optoelectrical efficiency of the monolayer by reducing shorting between particles, thereby possibly improving the number of optoelectronically functional particles within monolayer 912. Also, once oxidized, portions of coating 924 also insulates the top and bottom electrodes from each other, thereby preventing shorting.

In this embodiment, coating 924 is aluminum, but other materials can be used. In some examples, any metal layer that is conductive and can be reacted to form an insulator for the reasons discussed above can be used as the coating. In yet other examples, only those metals that can be reacted without undergoing a significant volumetric change, or otherwise becoming mechanically degraded or stressed, can be used. In yet further examples, a bi-layer of a conductive polymer followed by an insulating polymer can be used to form coating 924. Those skilled in the art will appreciate that other materials and combinations of materials can also be used to accomplish the intended functions of particle-encasing coating 924. Deposition methods that can be used to apply coating 924 are described above. Other applicable techniques not described are well known to those skilled in the art and require no further description.

At optional step 845 a second conformal coating 932 can deposited over encased-particle layer 928 (FIG. 9E) in order to function as an electrode of the finished device (FIG. 9I). This step is optional because coating 924 can be deposited such that it can operate as an electrode for finished device 900 and not merely as an Ohmic contact to p-type doped portion 916 of monolayer 912. In this example, second coating 932 is fabricated from molybdenum although, as with coating 924, any material can be used that will facilitate functioning of optoelectronic device 900. Many materials that can accomplish this goal have been presented above, and furthermore, materials well known to those skilled in the art can be used as second coating 932 without departing from the concepts of the present disclosure.

At step 850 a second substrate 936 is provided to the layered composite that includes encased-particle layer 928 to act as a substrate that can facilitate handling of the device as it is being fabricated, particularly during reverse-side processing. In this example, second substrate 936 is a layer of polyimide that is deposited using a spin-coating process. However, as discussed above, any number of materials and application methods can be used to apply second substrate 936, not merely those described here.

At step 855, temporary substrate 904 (FIG. 9E) is removed, thereby exposing a reverse face 940 (FIG. 9F) of encased-particle layer 928 and parts of undoped portion 920 of particles 912A embedded in the encased-particle layer. Removal of temporary substrate 904 can be facilitated by, as mentioned above in connection with optional step 810, the presence of low surface energy non-stick layer 908. Regardless of the presence of non-stick layer 908, temporary substrate 904 can be removed using techniques described above in the context of step 170 of method 100 of FIGS. 1A and 1B, and others known to those skilled in the art.

At step 860, and as shown in FIG. 9G, exposed reverse face 940 of encased-particle layer 928 is reacted to form an electrical insulating layer 944, thereby insulating the particles of monolayer 912 from each other and providing electrical insulation between the electrodes of the finished device (not shown), as explained above. Furthermore, some of the materials, processes, and criteria by which the reaction occurs were also explained above. Those skilled in the art will appreciate that the examples presented above are sufficient to illustrate the purpose and methods by which to implement such a method, and that other examples would be repetitive.

At step 865 the exposed surface of insulating layer 944 and the exposed surface of undoped portions 920 in monolayer 912 can be cleaned, as previously described in connection with step 830 and elsewhere in this disclosure, although this step is optional.

At step 870, undoped portion 920 of particles 912A within monolayer 912 are doped with an n-type dopant thereby forming an n-type doped portion 948 (FIG. 9H). With the addition of n-type doped portion 948 to particle forming monolayer 912, particles 912A already having a p-type doped portion 916, now have a p-n junction 952 disposed therein. The purpose and function of this arrangement have been described elsewhere in this disclosure and need no further explanation.

Continuing with method 800 and FIG. 9H, a transparent conductive layer 956 is deposited over insulating layer 944 and n-type doped portion 948 at step 875. As explained above, transparent conductive layer 956 facilitates electrical contact with the finished optoelectronic device and permits the transmission of light to/from p-n junctions 952 disposed within monolayer 912, depending on whether device 900 is a photovoltaic device or a light-generating device. An illustration of a device 900 within a circuit 960 is shown in FIG. 9I. It is noted that in FIG. 9I, device is shown with second substrate 936 removed. However, second substrate 936 can be left in place if desired.

Other Optoelectronic Devices

Figure 10:
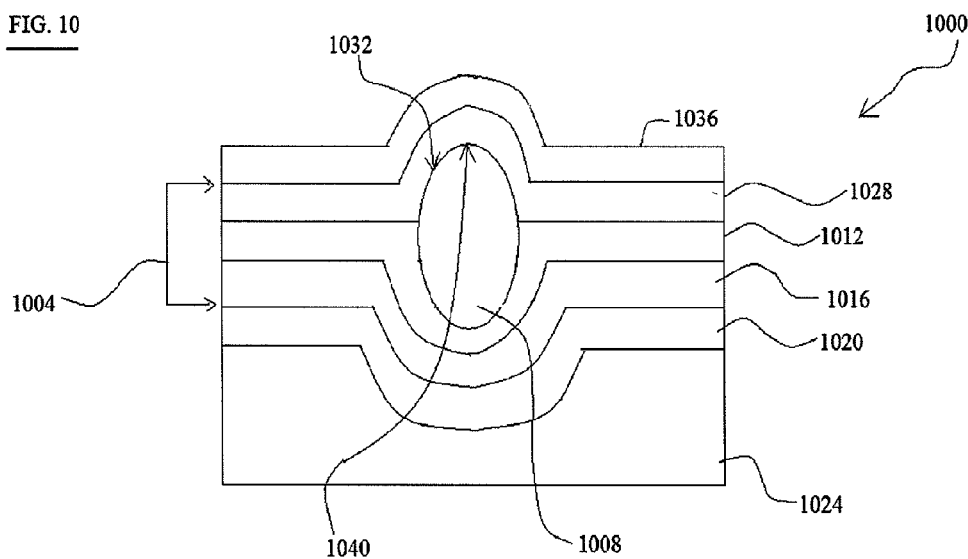
FIG. 10 is a diagram depicting a solar-type photovoltaic cell made in accordance with teachings of the present disclosure.
Figure 11:
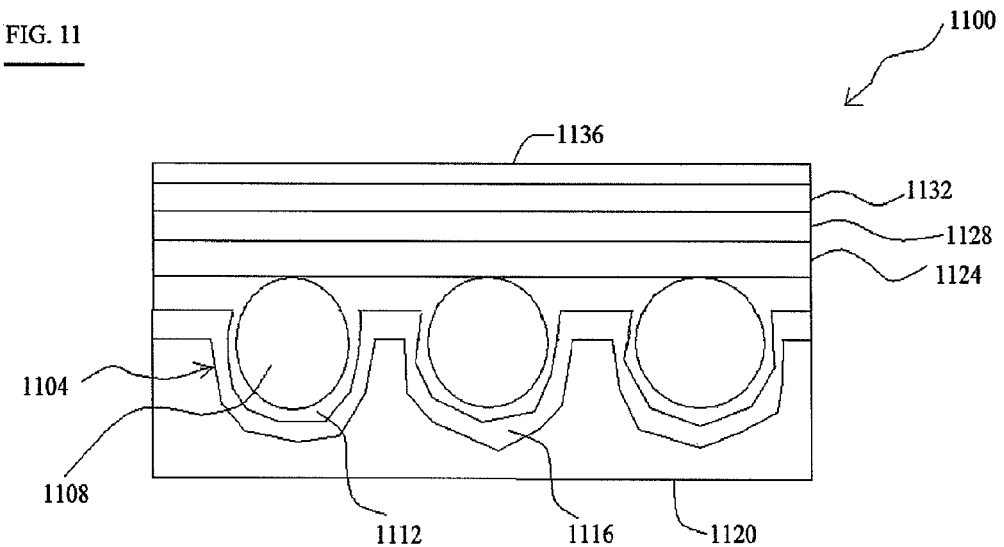
FIG. 11 is a diagram depicting a light emitting diode made in accordance with teachings of the present disclosure.

While the above detailed example has presented a monolayer having p-n junctions disposed only within the particles forming the monolayer, the broad teachings of the present disclosure can be applied to a wide variety of device architectures and doping schemes. FIGS. 10 and 11 present a small selection of the many optoelectronic devices that can be fabricated according to the methods and techniques disclosed herein. Those skilled in the art will appreciate that these devices are generally similar to conventionally fabricated devices except for the inclusion of the monolayer formed from a plurality semiconducting particles. Because of these similarities, for the sake of brevity, the following examples highlight the monolayer formed from semiconductor particles in each device, but otherwise simply provide a listing of the element numerals for the other components.

FIG. 10 illustrates a p-n junction based solar-type photovoltaic cell 1000 that includes an encased-particle layer 1004 formed from ex situ doped (here, p-type) semiconducting particles (only one particle 1008 shown) encased by a pair of coatings, a doped semiconductor coating 1012, here a p-doped hydrogenated silicon layer, and an Ohmic contact coating 1016, here an aluminum layer. A first electrode layer 1020, in the example molybdenum, is applied to coating 1016. After the formation of electrode layer 1020, a substrate 1024 is applied, in this case by spin coating a polyimide material onto the electrode layer.

As those skilled in the art will be able to readily envision, encased-particle layer 1004 was originally formed on a temporary substrate (not shown), followed by application of p-doped amorphous hydrogenated silicon coating 1012, Ohmic contact coating 1016, electrode layer 1020, and substrate 1024. After the application of substrate 1024, the temporary substrate was removed and an n-doped hydrogenated silicon layer 1028 applied to the reverse side 1032 of encased-particle layer 1004. Following the application of n-doped silicon layer 1028, a transparent electrode 1036, here an indium tin oxide (ITO) layer, was provided. Furthermore, as those skilled in the art will appreciate, optional re-crystallization steps (analogous to optional step 150 in method 100 depicted in FIGS. 1A and 1B) may be performed following the deposition of some, or all, of the layers deposited, including, but not limited to, those described above.

In this example, a p-n junction 1040 is formed between the combination of p-doped particles 1008 and p-doped amorphous hydrogenated silicon coating 1012 on the one side and n-doped amorphous hydrogenated silicon layer 1028 on the other side. In this case, the doped particles 1008 increase the area of p-n junction 1040, thereby increasing the area available for recombination of charge carriers. As those skilled in the art will readily appreciate, the components of the p-n junction based device can be fabricated using techniques described above. FIG. 11 illustrates a p-n junction based LED structure 1100 that includes an encased-particle layer 1104 formed, in part, from ex situ doped (here, n-type) semiconducting GaN particles 1108. As described above, GaN particles 1108 may also be deposited as un-doped particles, and subsequently doped in situ. Encased particle layer 1104 is further fabricated by encasing particle 1108 with a conformal conductive layer 1112 (here a titanium/aluminum layer), which is followed by encasing the particle and the conductive layer with a conformal insulator layer 1116. A substrate 1120 is then deposited over insulating layer 1116.

The method used to prepare LED structure 1100 is consistent, in part, with method 800 depicted in FIGS. 8A and 8B with concurrent reference to FIGS. 9A-9I. However, in addition to the steps presented in the context of method 800, which, in this example, include a reverse face of encased particle layer 1104, and depositing an n-doped GaN layer 1124 on the reverse face (among other steps previously described), is an additional step at which a InGaN quantum well layer 1128 is deposited over n-doped GaN layer 1124. A p-doped GaN layer 1132 is then deposited over InGaN quantum well coating 1128, in furtherance of fabricating LED 1100. LED 1100 is then further processed consistent with present disclosure to include a transparent electrode layer 1136, as described above. These layers need no further description, having been described above in the context of, for example, FIG. 8A at steps 845 and 850.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of fabricating an optoelectronic device, comprising:
    providing a first substrate having a first surface;
    applying a monolayer of semiconductor particles to the first surface;
    encasing the semiconductor particles of the monolayer with one or more coatings so as to form an encased-particle layer having an interface side confronting the first surface of the first substrate;
    separating the first substrate and the encased-particle layer from one another so as to expose the interface side of the encased-particle layer; and
    processing the interface side of the encased-particle layer to at least include a first electrode.

2. A method according to claim 1, wherein said applying the monolayer includes applying the monolayer so that the semiconductor particles are spaced from one another.

3. A method according to claim 1, further comprising applying an anti-agglomeration layer to the first surface prior to applying the monolayer, the anti-agglomeration layer provided to facilitate separation of the semiconductor particles in the monolayer from each other.

4. A method according to claim 1, further comprising applying a low surface energy release layer to the first surface of the first substrate prior to said applying the monolayer.

5. A method according to claim 1, further comprising doping the semiconductor particles.

6. A method according to claim 5, wherein said doping includes doping the semiconductor particles when present in the monolayer.

7. A method according to claim 5, wherein said doping results in forming a p-n junction within each of the semiconductor particles.

8. A method according to claim 7, wherein said doping includes doping the semiconductor particles when present in the monolayer.

9. A method according to claim 1, wherein encasing the semiconductor particles includes providing an encased-particle layer.

10. A method according to claim 9, wherein said providing the encased-particle layer includes providing a semiconductor layer.

11. A method according to claim 1, wherein said encasing includes depositing a conformal conductive layer over the monolayer.

12. A method according to claim 11, further comprising, following said separating, providing a reactant to the conformal metallic layer from the interface side so as to react a portion of the conformal metallic layer on the interface side into an insulating layer.

13. A method according to claim 1, further comprising, prior to said separating, applying a second electrode over the encased-particle layer.

14. A method according to claim 1, further comprising, prior to said separating, applying a second substrate opposite the interface side of the encased-particle layer.

15. A method according to claim 14, wherein said applying the second substrate includes forming the second substrate from a flowable material.

16. A method according to claim 15, wherein said forming the second substrate from the flowable material includes forming the second substrate from a polyimide.

17. A method according to claim 14, wherein said applying the second substrate includes applying a preformed substrate.

18. A method according to claim 1, further comprising performing further processing to make the optoelectronic device a functional photovoltaic cell in which the semiconductor particles participate in generating electricity from photons during use.

19. A method according to claim 1, further comprising performing further processing to make the optoelectronic device a functional light emitting device in which the semiconductor particles participate in generating light from electricity during use.

20. A method according to claim 1, further comprising passivating the surface of each of the semiconductor particles of the monolayer.

21. A method according to claim 20, wherein said passivating includes growing an oxide shell substantially encapsulating each of the semiconductor particles of the monolayer.

22. A method according to claim 20, wherein said passivating includes substantially encapsulating each of the semiconductor particles of the monolayer within a corresponding metal shell.

23. A method according to claim 1, wherein said applying the monolayer includes applying the semiconductor particles to the first surface of the first substrate using a dynamic surface tension process.

24. A method according to claim 1, wherein the semiconductor particles have a first charge polarity, and said applying the monolayer includes:
charging the first surface of the first substrate with a second charge polarity opposite the first charge polarity of the semiconductor particles; and
permitting a monolayer of semiconductor particles to electrostatically deposit on the first surface via interaction of the first and second charge polarities.

25. A method according to claim 1, wherein said applying the monolayer includes:
providing a particle donor having a donor region containing a monolayer thickness of the semiconductor particles;
engaging the donor region with the first surface of the first substrate; and
separating the first substrate and particle donor from one another so that the semiconductor particles remain engaged with the first substrate in the monolayer thickness.

26. A method according to claim 1, wherein said applying the monolayer includes temporarily holding the semiconductor particles in a plurality of spaced fenestrations proximate to the first surface.

27. A method according to claim 26, wherein said temporarily holding the semiconductor particles includes applying a vacuum to the semiconductor particles.

28. A method according to claim 26, wherein said temporarily holding the semiconductor particles includes adhesively holding the semiconductor particles.

29. An apparatus, comprising:
an optoelectronic device having optoelectronic functionality when operating, said optoelectronic device including:
an encased-particle layer containing a monolayer of semiconductor particles encased by one or more coatings and including first and second sides spaced from one another, wherein said semiconductor particles participate in the optoelectronic functionality when said optoelectronic device is operating;
a first electrode located on said first side of said encased-particle layer and electrically coupled to said semiconductor particles; and
a second electrode located on said second side of said encased-particle layer and electrically coupled to said semiconductor particles.

30. An apparatus according to claim 29, wherein said optoelectronic device is a photovoltaic cell and said semiconductor particles participate in the photovoltaic effect of said photovoltaic cell during use.

31. An apparatus according to claim 29, wherein said optoelectronic device is a light emitting device and said semiconductor particles participate in generating of light during use.

32. An apparatus according to claim 29, wherein said encased-particle layer includes an encased-particle layer proximate said semiconductor particles.

33. An apparatus according to claim 32, wherein said encased-particle layer includes a portion of a metallic layer reacted with a reactant to change said portion into an insulator.

34. An apparatus according to claim 32, wherein said encased-particle layer includes a semiconductor layer applied over said semiconducting particles.

35. An apparatus according to claim 29, wherein each of said semiconductor particles has only one dopant charge type.

36. An apparatus according to claim 29, wherein each of said semiconductor particles contains a p-n junction.

37. An apparatus according to claim 29, wherein each of said semiconductor particles has a passivating layer.

38. An apparatus according to claim 37, wherein said passivating layer includes a metallic layer.

39. An apparatus according to claim 37, wherein said passivating layer includes an oxide layer.

40. An apparatus according to claim 29, further comprising a substrate applied over said first electrode.

41. An apparatus according to claim 40, wherein said substrate includes a polyimide layer.

42. An apparatus according to claim 29, wherein said second electrode is a transparent electrode.

43. An apparatus according to claim 29, wherein said monolayer of said semiconductor particles includes a monolayer of silicon particles.

44. An apparatus according to claim 29, wherein said monolayer of said semiconductor particles includes a monolayer of GaAs particles.

45. An apparatus according to claim 29, wherein said monolayer of semiconductor particles includes a monolayer of CdS particles.

46. An apparatus according to claim 29, wherein said monolayer of particles includes a monolayer of copper indium gallium di-selenide particles.

47. An apparatus according to claim 29, wherein said monolayer of particles includes a monolayer of Gallium Nitride particles.

48. An apparatus according to claim 29, wherein said monolayer of particles includes a monolayer of Indium Gallium Nitride particles.

49. An apparatus according to claim 29, wherein said monolayer of particles includes a monolayer of Aluminum Gallium Nitride (AlGaN) particles.

* * * * *